US010164417B2

United States Patent
Kobayashi et al.

(10) Patent No.: US 10,164,417 B2
(45) Date of Patent: *Dec. 25, 2018

(54) CIRCUIT ASSEMBLY AND ELECTRICAL JUNCTION BOX

(71) Applicants: AutoNetworks Technologies, Ltd., Yokkaichi, Mie (JP); Sumitomo Wiring Systems, Ltd., Suzuka (JP); Sumitomo Electric Industries, Ltd., Osaka (JP)

(72) Inventors: Takehito Kobayashi, Mie (JP); Yoshikazu Sasaki, Mie (JP); Shigeki Yamane, Mie (JP); Yukinori Kita, Mie (JP); Tomohiro Ooi, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/307,703

(22) PCT Filed: Apr. 21, 2015

(86) PCT No.: PCT/JP2015/062088
§ 371 (c)(1),
(2) Date: Oct. 28, 2016

(87) PCT Pub. No.: WO2015/170583
PCT Pub. Date: Nov. 12, 2015

(65) Prior Publication Data
US 2017/0047720 A1 Feb. 16, 2017

(30) Foreign Application Priority Data
May 9, 2014 (JP) ................................. 2014-097717

(51) Int. Cl.
*F23Q 7/00* (2006.01)
*H02G 3/16* (2006.01)
(Continued)

(52) U.S. Cl.
CPC ............. *H02G 3/16* (2013.01); *H05K 1/0203* (2013.01); *H05K 1/115* (2013.01); *H05K 1/117* (2013.01);
(Continued)

(58) Field of Classification Search
USPC .................................. 361/248, 760; 174/520
See application file for complete search history.

(56) References Cited

U.S. PATENT DOCUMENTS

2004/0253850 A1* 12/2004 Naitou ................... H05K 1/144
439/76.2

FOREIGN PATENT DOCUMENTS

| JP | 2005-080354 A | 3/2005 |
| JP | 2005-228799 A | 8/2005 |
| JP | 2013-099071 A | 5/2013 |

OTHER PUBLICATIONS

JP 2013-099071.*

* cited by examiner

*Primary Examiner* — Andargie M Aychillhum
(74) *Attorney, Agent, or Firm* — Honigman Miller Schwartz and Cohn LLP

(57) ABSTRACT

Provided is a circuit assembly that includes: a circuit board that has a connection opening; a plurality of busbars that are laid on one surface side of the circuit board; a coil that includes a main portion and a plurality of lead terminals, the lead terminals being connected to the plurality of busbars exposed through the connection opening; and a heatsink that is laid, via an adhesive agent, on surfaces of the plurality of busbars that face away from the circuit board. The circuit (Continued)

board is provided with a substrate through-hole in the vicinity of the connection opening, and the plurality of busbars are provided with a busbar through-hole at the position that corresponds to the substrate through-hole.

4 Claims, 6 Drawing Sheets

(51) Int. Cl.
*H05K 1/02* (2006.01)
*H05K 1/11* (2006.01)
*H05K 1/18* (2006.01)
*H05K 5/00* (2006.01)

(52) U.S. Cl.
CPC ........... *H05K 1/181* (2013.01); *H05K 5/0069* (2013.01); *H05K 2201/10272* (2013.01)

CIRCUIT ASSEMBLY AND ELECTRICAL JUNCTION BOX

CROSS-REFERENCE TO RELATED APPLICATIONS

This application is the U.S. national stage of PCT/JP2015/062088 filed Apr. 21, 2015, which claims priority of Japanese Patent Application No. JP 2014-097717 filed May 9, 2014.

FIELD OF THE INVENTION

A technique disclosed in the present description relates to a circuit assembly and an electrical junction box.

BACKGROUND

Conventionally, devices in which a circuit assembly provided with a circuit board on which various electronic components are mounted is accommodated in a case are known as devices for energizing and de-energizing in-car electric components.

In such devices, the electronic components mounted on the circuit board are small and have superior functionality.

However, these electronic components generate a relatively large amount of heat, and thus if heat generated by the electronic components stays in the case, the temperature in the case will increase, causing a risk that the performance of the electronic components accommodated in the case decreases.

Accordingly, as an example of various structures for discharging the heat generated by the circuit board or the electronic components, a circuit assembly 111 as shown in FIG. 6 is conceivable that has a configuration in which a heat discharging member 130 is provided on that surface of a circuit board 112 that is opposite to the surface on which an electronic component 115 is provided.

On the other hand, as shown in FIGS. 5 and 6, a configuration is also conceivable in which the circuit board 112 has an opening 113 in a region that corresponds to the electronic component 115, a plurality of busbars 120 are provided on that surface of the circuit board 112 that is opposite to the surface on which the electronic component 115 is arranged, and terminals 117 of the electronic component 115 are connected to the busbars 120 exposed through the opening 113. By configuring an electric power circuit with the plurality of busbars 120, it is possible to let a high current flow through the electric power circuit.

However, when the electronic component 115 is connected to the plurality of busbars 120 via the opening 113 formed in the circuit board 112, as shown in FIG. 6, an adhesive agent 135 for bonding the heat discharging member that is laid (layered) on the surfaces of the busbars 120 that face away from the circuit board 112 may enter a gap S between adjacent busbars 120, and may get in contact with a lower surface of a main portion 116 of the electronic component 115. In such a situation, if the adhesive agent 135 expands due to the heat generated by the circuit board 112 or the electronic component 115, or adversely contracts by being cooled, the electronic component 115 will be pushed up or drawn in by the adhesive agent 135, possibly causing a connection failure such as a crack in a connection section between the terminal 117 and the busbar 120.

The technique disclosed in the present description was made in view of the above-described circumstances, and it is an object thereof to provide a circuit assembly and an electrical junction box that have high connection reliability.

SUMMARY OF INVENTION

The technique disclosed in the present description relates to a circuit assembly including: a circuit board that has a connection opening; a plurality of busbars that are laid on one surface side of the circuit board; an electronic component that has a main portion and a plurality of lead terminals, the lead terminals being connected to the plurality of busbars that are exposed through the connection opening; and a heatsink that is laid, via an adhesive agent, on surfaces of the plurality of busbars that face away from the circuit board, wherein the circuit board is provided with a substrate through-hole in a vicinity of the connection opening, and the plurality of busbars are provided with a busbar through-hole at a position that corresponds to the substrate through-hole.

According to the technique disclosed in the present description, the substrate through-hole and the busbar through-hole are contiguous, and since the adhesive agent located in the vicinity of the connection opening escapes into not only a gap between adjacent busbars but also the through-holes, the amount of adhesive agent that enters the gap between the busbars is reduced, and the adhesive agent is prevented from directly contacting the lower surface of the main portion of the electronic component. Accordingly, even if the adhesive agent thermally expands due to heat from the electronic component or the circuit board, or adversely contracts by being cooled, the electronic component is prevented from being directly affected by the thermal expansion or contraction, also preventing the connection sections between the lead terminals and the busbars from being affected. It is thus possible to achieve a circuit assembly and an electrical junction box that have high connection reliability.

The circuit assembly may have a configuration in which the plurality of busbars are laid on the circuit board via an adhesive sheet, and the adhesive sheet is provided with a sheet through-hole at a position that corresponds to the substrate through-hole.

According to the foregoing aspect, also if the plurality of busbars are laid on the circuit board via the adhesive sheet, the same effects can be obtained, by providing the adhesive sheet with the sheet through-hole at a position that corresponds to the substrate through-hole so that the substrate through-hole, the sheet through-hole, and the busbar through-hole are contiguous.

Furthermore, the technique disclosed in the present description relates to an electrical junction box in which the circuit assembly is accommodated in a case.

According to the technique disclosed in the present description, it is possible to achieve a circuit assembly or an electrical junction box that have improved connection reliability.

DETAILED DESCRIPTION OF THE PREFERRED EMBODIMENTS

Figure 1:
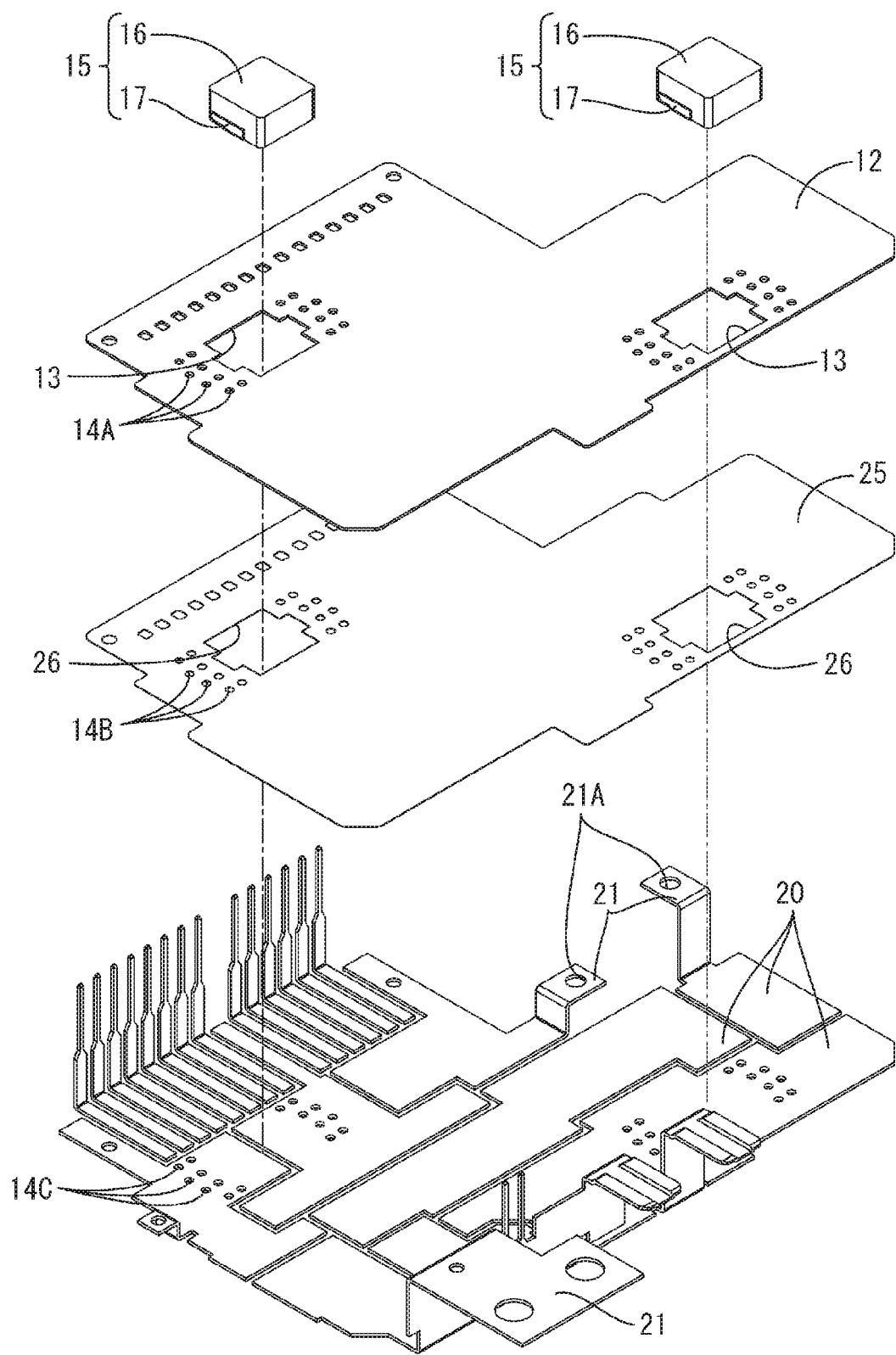
FIG. 1 is an exploded perspective view illustrating a part of a circuit assembly according to an embodiment.
Figure 2:
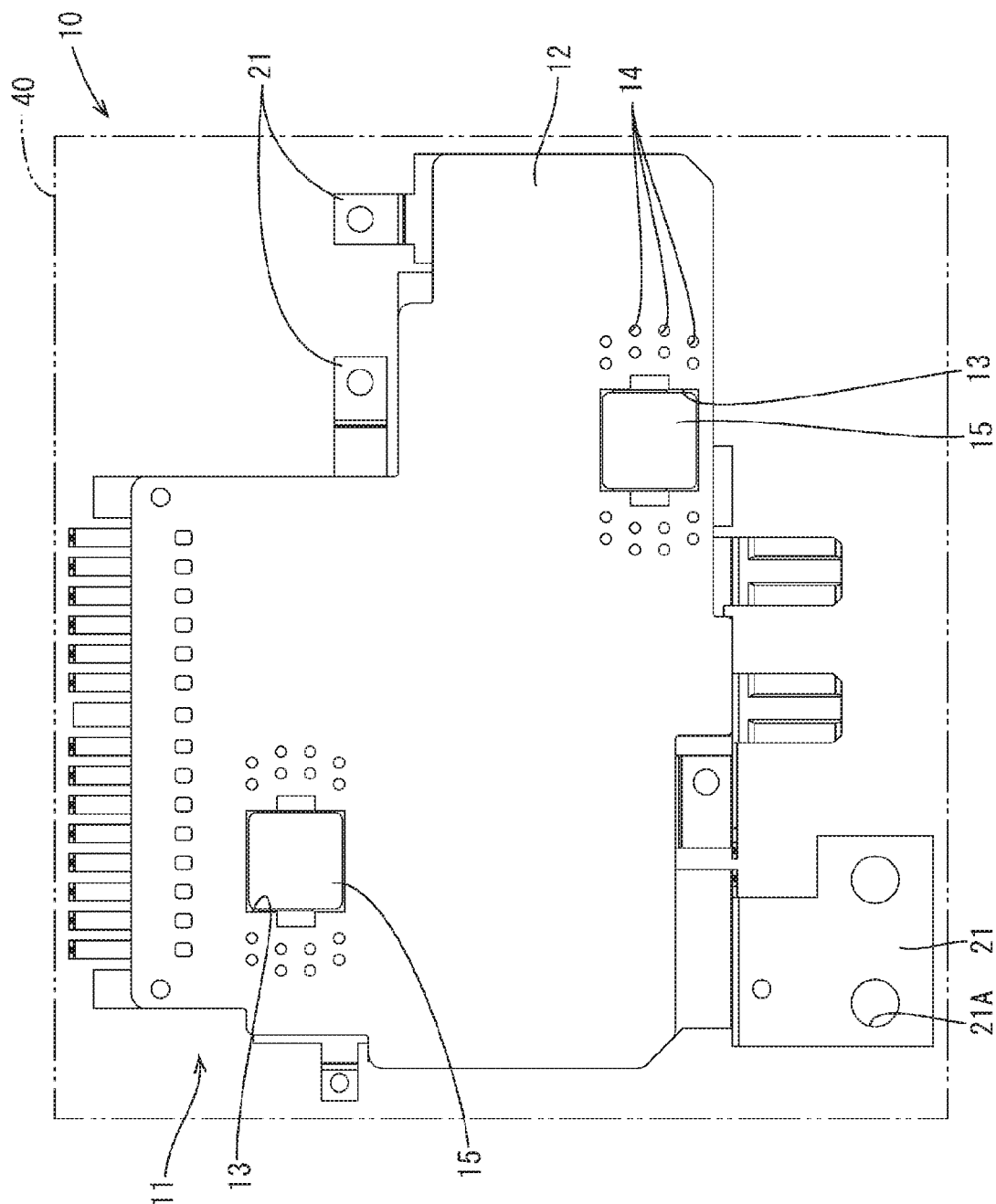
FIG. 2 is a plan view illustrating the inside of an electrical junction box.

An embodiment will be described with reference to FIGS. 1 to 4.

An electrical junction box 10 of the present embodiment is provided with a circuit assembly 11 that includes a circuit board 12 and a heatsink 30, and a synthetic resin case 40 that accommodates the circuit assembly 11. Note that in the following description, the upper side of FIG. 1 refers to "front side" or "upper side", and the lower side of FIG. 1 refers to "rear side" or "lower side".

As shown in FIG. 1, the circuit assembly 11 is provided with the circuit board 12, coils 15 that are arranged on the front surface (upper surface of FIG. 1) of the circuit board 12, a plurality of busbars 20 that are arranged on the rear surface (lower surface of FIG. 1) of the circuit board 12, and the heatsink 30 (see FIG. 4) that is arranged on the rear surfaces of the busbars 20.

The circuit board 12 is substantially L-shaped, and has, on its front surface, conductive circuitry that is not shown and is achieved by printed wiring.

Figure 4:
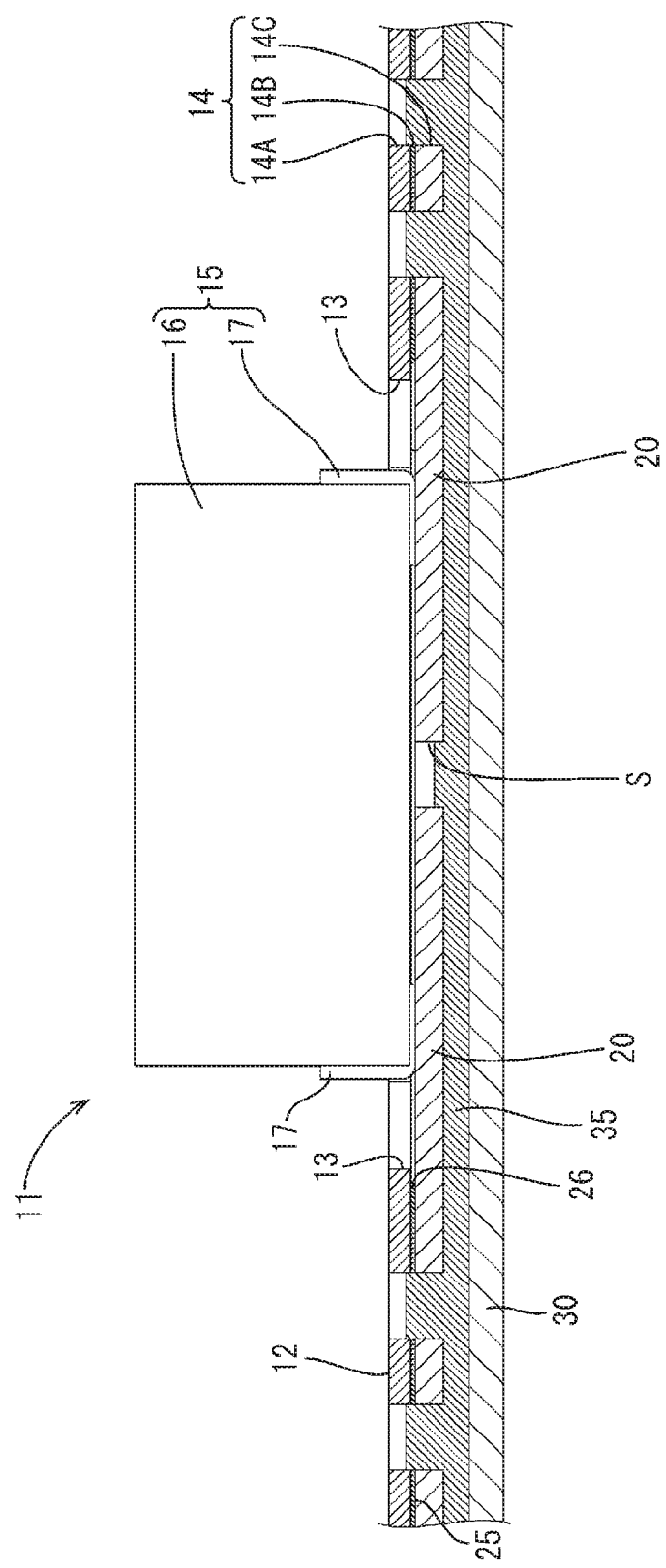
FIG. 4 is a partial cross-sectional view taken along a line A-A of FIG. 3.
Figure 5:
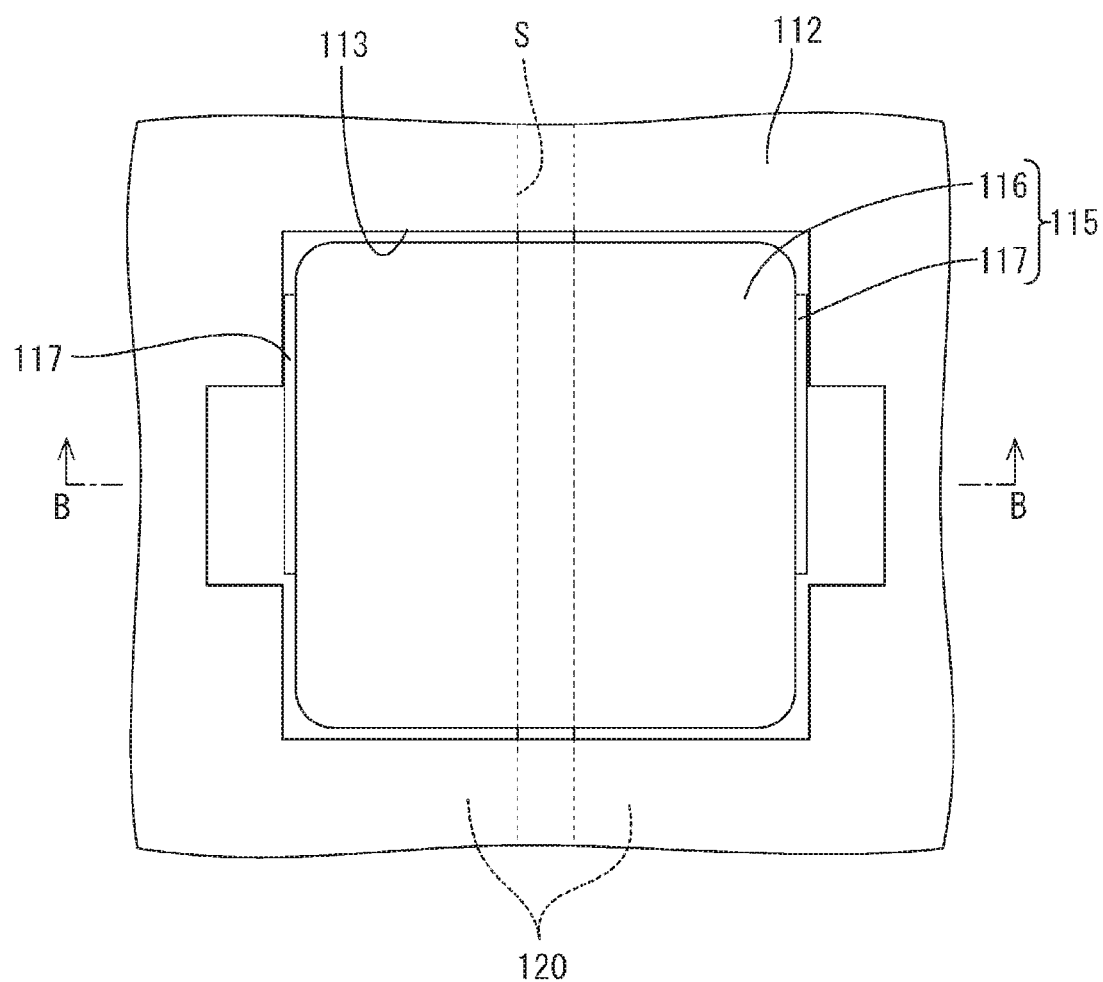
FIG. 5 is a partially enlarged plan view illustrating the state in which a coil is connected to busbars, according to a hypothetical technique.
Figure 6:
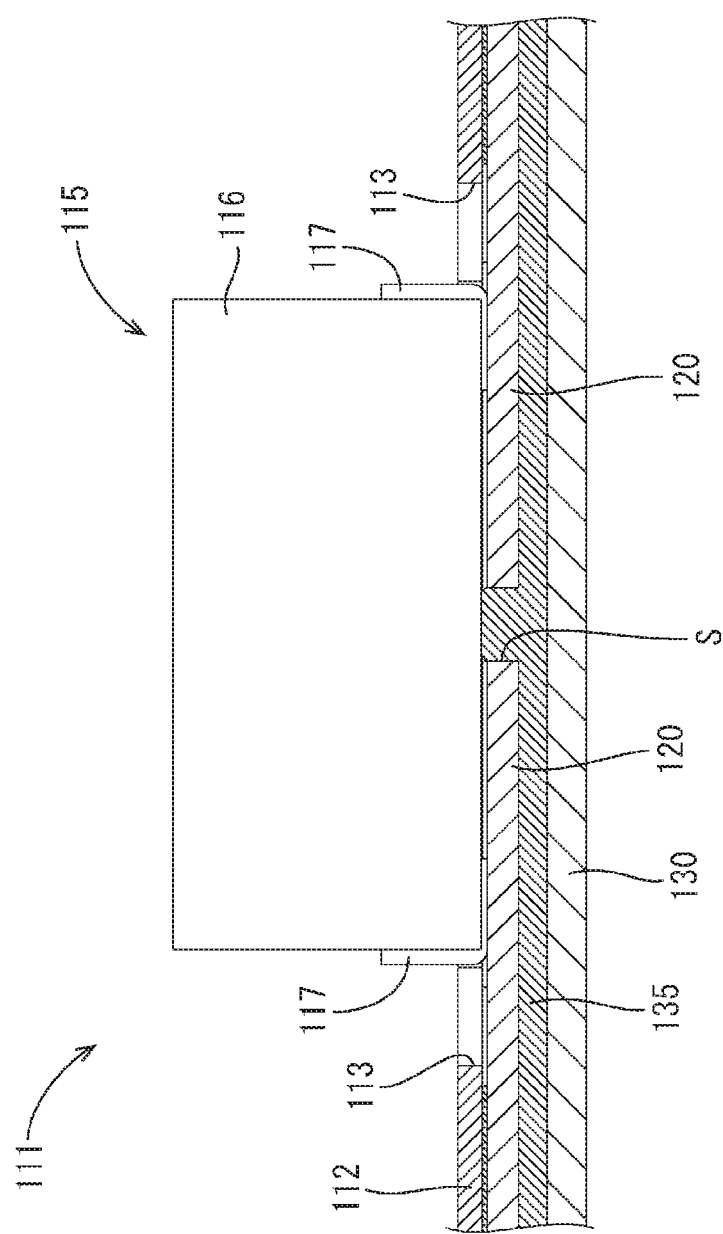
FIG. 6 is a partial cross-sectional view taken along a line B-B of FIG. 5.

The coils 15 are surface-mounted coils, and have, as shown in FIGS. 1 and 4, a main portion 16 in the shape of a rectangular parallelepiped, and a pair of lead terminals 17 provided in the vicinity of two opposing side edges of the bottom surface of the main portion 16.

The plurality of busbars 20 are formed by pressing a metal plate into predetermined shapes. The busbars 20 are substantially rectangular, and are arranged in a predetermined pattern with a gap S between adjacent busbars 20. Some busbars 20 have, on an edge thereof, a connecting piece 21 that protrudes outward and is formed as one piece with the corresponding busbar 20. Each connecting piece 21 has a bolt mounting hole 21A through which a bolt is inserted, and is configured to be electrically connected to an external power supply, by the bolt (not shown) being inserted through the bolt mounting hole 21A and being screwed to a power supply terminal mounted on a vehicle.

The plurality of busbars 20 are adhered to the rear surface of the circuit board 12 via an insulating adhesive sheet 25. The adhesive sheet 25 has substantially the same shape as the circuit board 12.

Figure 3:
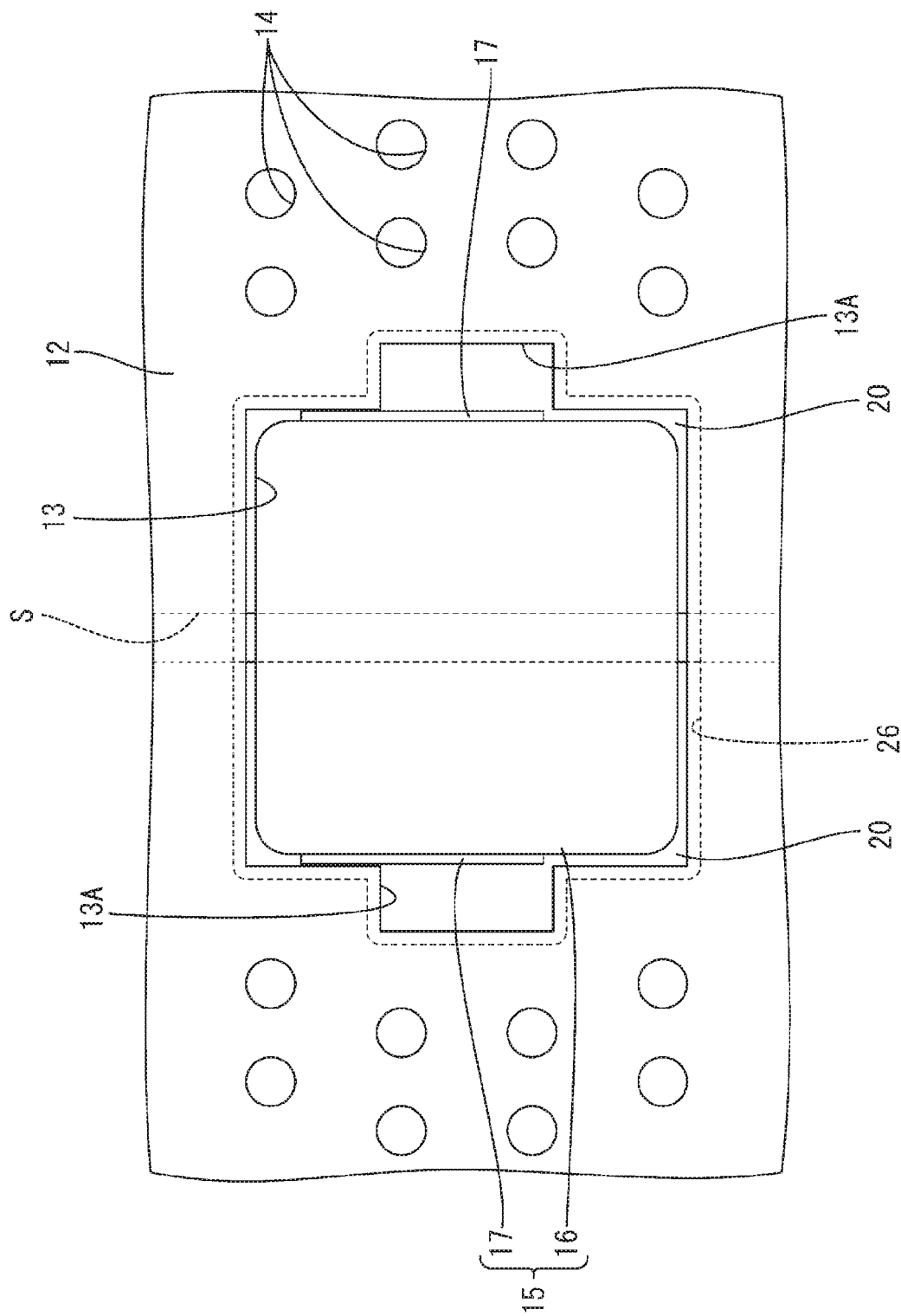
FIG. 3 is a partially enlarged plan view illustrating the state in which a coil is connected to busbars.

As shown in FIG. 1, the circuit board 12 has, at positions at which the coils 15 are arranged, connection openings 13 for mounting the coils 15 on the busbars 20. As shown in FIG. 3, the part of each connection opening 13 in which the main portion 16 of the coil 15 is arranged is an opening in the shape of a rectangle that is slightly larger than the bottom surface of the main portion 16. Furthermore, openings with a small width (hereinafter, referred to as "extended portions 13A") are formed extending from a pair of edge portions on which the lead terminals 17 of the coil 15 are located.

Furthermore, the adhesive sheet 25 has, at the positions that correspond to the connection openings 13 of the circuit board 12, sheet openings 26 that have substantially the same shape as the connection openings 13 and have an opening size slightly larger than that of the connection openings 13 (see FIGS. 1 and 3).

Furthermore, the circuit board 12 is provided with a plurality of substrate through-holes 14A having a small diameter in the region in the vicinity of the pairs of extended portions 13A of the connection openings 13, the adhesive sheet 25 is provided with sheet through-holes 14B at the positions that correspond to the substrate through-holes 14A, and the plurality of busbars 20 are provided with busbar through-holes 14C at the positions that correspond to the substrate through-holes 14A (see FIG. 3). By these through-holes 14A, 14B, and 14C overlapping each other, holes 14 that penetrate through the stack of the circuit board 12, the adhesive sheet 25, and the plurality of busbars 20 are formed.

The coils 15 are arranged on the front surface side of the circuit board 12, namely, in the region in which the connection openings 13 are formed. In the present embodiment, the lead terminals 17 of the coils 15 are connected to the surfaces of the pair of busbars 20 that are exposed through the connection opening 13 and the sheet opening 26 by a well-known method such as soldering.

The heatsink 30 is arranged on the lower surfaces (rear surfaces) of the busbars 20 (see FIG. 4). The heatsink 30 is a plate-shaped member that is made of a metal material such as aluminum or an aluminum alloy that is excellent in heat conductivity, and has the function to discharge heat generated in the circuit board 12 and the coils 15. The heatsink 30 is adhered to the rear surface side of the busbars 20 with, for example, a thermosetting adhesive agent 35. The adhesive agent 35 is an adhesive agent that is insulating and has heat conductivity.

The following will describe an example of a method for manufacturing the electrical junction box 10 according to the present embodiment. First, as shown in FIG. 1, the adhesive sheet 25 cut in a predetermined shape is laid on the lower surface of the circuit board 12 on whose front surface an electrically conductive path is formed by printed wiring, and the plurality of busbars 20 arranged in a predetermined pattern are pressed thereto. Accordingly, the circuit board 12 and the plurality of busbars 20 are adhered and fixed to each other via the adhesive sheet 25. In this state, parts of the upper surfaces of the plurality of busbars 20 are exposed through the connection openings 13 of the circuit board 12 and the sheet openings 26 of the adhesive sheet 25.

Then, solder is applied to predetermined positions of the circuit board 12 by screen printing. Then, the coils 15 are placed at the predetermined positions, and reflow soldering is carried out.

Then, the adhesive agent 35 is applied to the upper surface of the heatsink 30, and the circuit board 12 on which the coils 15 and the plurality of busbars 20 are arranged is laid thereon from above. At this time, since the stack of the circuit board 12, the adhesive sheet 25, and the busbars 20 has the plurality of holes 14 that penetrate therethrough, the adhesive agent 35 escapes into not only the gaps S between adjacent busbars 20 but also the holes 14 (see FIG. 4). Thereafter, the adhesive agent 35 is cured by application of heat.

Lastly, the circuit board 12 (circuit assembly 11) on which the heatsink 30 is laid is accommodated in the case 40, and thus the electrical junction box 10 is obtained.

The following will describe the functions and effects of the electrical junction box 10 according to the present embodiment. According to the present embodiment, since the adhesive agent 35 located in the vicinity of the connection openings 13 escapes (enters) into not only the gaps S between the adjacent busbars 20 but also the plurality of holes 14, the amount of the adhesive agent 35 that enters the gaps S between the busbars 20 is reduced, and the adhesive agent 35 is prevented from getting in direct contact with the lower surfaces of the main portions 16 of the coils 15. Accordingly, even if the adhesive agent 35 thermally expands due to the heat of the coils 15 or the circuit board 12, or adversely contracts by being cooled, the main portions 16 of the coils 15 is prevented from being directly affected by the thermal expansion or contraction, making it difficult for the connection sections between the busbars 20 and the lead terminals 17 to be affected. That is, it is possible to achieve a circuit assembly 11 and an electrical junction box 10 that have high connection reliability.

Moreover, according to the present embodiment, the plurality of busbars 20 are laid on the circuit board 12 via the adhesive sheet 25, and the adhesive sheet 25 has the sheet through-holes 14B at the positions that correspond to the substrate through-holes 14A. Accordingly, the substrate through-holes 14A, the sheet through-holes 14B, and the busbar through-holes 14C are contiguous, and thus it is possible to let the adhesive agent 35 escape from the substrate through-holes 14A, the sheet through-holes 14B, and the busbar through-holes 14C.

OTHER EMBODIMENTS

The technique disclosed by the present description is not limited to the embodiment described in the foregoing description and drawings, and encompasses, for example, the following various aspects.

(1) In the foregoing embodiment, the plurality of holes 14 are formed in the region in the vicinity of the extended portions 13A, but the plurality of holes 14 may be formed in the surrounding of the connection openings 13. In short, the plurality of holes 14 may be formed at any positions as long as the holes 14 do not affect the conductive pattern of the circuit board 12.

(2) The positions, shape, and the number of the holes 14 are not limited to those of the foregoing embodiment, and another configuration is also possible, such as one in which a pair of elongated holes are formed, for example.

(3) The foregoing embodiment has described an example in which the coils 15 are mounted, but the present invention is applicable to the case where, instead of the coils 15, other electronic components such as capacitors or shunt resistors are mounted.

The invention claimed is:
1. A circuit assembly comprising:
a circuit board that has a connection opening;
a plurality of busbars that are laid on one surface side of the circuit board;
an electronic component that has a main portion and a plurality of lead terminals, the lead terminals being connected to the plurality of busbars that are exposed through the connection opening; and
a heatsink that is laid, via an adhesive agent, on surfaces of the plurality of busbars that face away from the circuit board,
wherein the circuit board is provided with a substrate through-hole in a vicinity of the connection opening, and
the plurality of busbars are provided with a busbar through-hole at a position that corresponds to the substrate through-hole so as to form a unitary through-hole extending through the plurality of busbars and the substrate, and wherein the adhesive agent is disposed within a gap between the plurality of busbars and the unitary through-hole.
2. The circuit assembly according to claim 1,
wherein the plurality of busbars are laid on the circuit board via an adhesive sheet, and the adhesive sheet is provided with a sheet through-hole at a position that corresponds to the substrate through-hole.
3. An electrical junction box in which the circuit assembly according to claim 1 is accommodated in a case.
4. An electrical junction box in which the circuit assembly according to claim 2 is accommodated in a case.

* * * * *